US012771961B2

(12) United States Patent
Azuhata

(10) Patent No.: US 12,771,961 B2
(45) Date of Patent: Oct. 20, 2026

(54) SOLID-STATE IMAGING DEVICE AND COMPARISON DEVICE

(71) Applicant: Sony Semiconductor Solutions Corporation, Kanagawa (JP)

(72) Inventor: Satoshi Azuhata, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 19/111,607

(22) PCT Filed: Sep. 14, 2023

(86) PCT No.: PCT/JP2023/033578

§ 371 (c)(1),
(2) Date: Mar. 13, 2025

(87) PCT Pub. No.: WO2024/075492

PCT Pub. Date: Apr. 11, 2024

(65) Prior Publication Data

US 2026/0089405 A1 Mar. 26, 2026

(30) Foreign Application Priority Data

Oct. 5, 2022 (JP) ................................ 2022-161175

(51) Int. Cl.
*H04N 25/616* (2023.01)
*H04N 25/771* (2023.01)
(Continued)

(52) U.S. Cl.
CPC ......... *H04N 25/616* (2023.01); *H04N 25/771* (2023.01); *H04N 25/772* (2023.01); *H04N 25/78* (2023.01); *H10F 39/809* (2025.01)

(58) Field of Classification Search
CPC .. H04N 25/616; H04N 25/772; H04N 25/771; H04N 25/78; H10F 39/809
(Continued)

(56) References Cited

U.S. PATENT DOCUMENTS

2016/0360138 A1 12/2016 Meynants

FOREIGN PATENT DOCUMENTS

EP 3684050 * 7/2022
JP 2013065970 A 4/2013
(Continued)

OTHER PUBLICATIONS

International Search Report (PCT/ISA/210), International Application No. PCT/JP2023/033578, dated Nov. 28, 2023.

*Primary Examiner* — Joel W Fosselman
(74) *Attorney, Agent, or Firm* — Michael Best & Friedrich LLP

(57) ABSTRACT

High-speed and high-performance signals are compared. In one example, a solid-state imaging element includes a comparison circuit, a first switch, a second switch, a third switch, a first capacitor, and a second capacitor. The comparison circuit includes a non-inverting input terminal and an inverting input terminal. The first switch is connected to the inverting input terminal. The second switch is connected to the inverting input terminal and controlled at a timing different from that of the first switch. The third switch is connected between an output terminal of the comparison circuit and the inverting input terminal. One end of the first capacitor is connected to the inverting input terminal via the first switch, and a reference signal is applied to the other end. One end of the second capacitor is connected to the inverting input terminal via the second switch, and a reference signal is applied to the other end.

11 Claims, 9 Drawing Sheets

1

(51) Int. Cl.
*H04N 25/772* (2023.01)
*H04N 25/78* (2023.01)
*H10F 39/00* (2025.01)

(58) Field of Classification Search
USPC .......................................................... 348/302
See application file for complete search history.

(56) References Cited

FOREIGN PATENT DOCUMENTS

| | | | |
|---|---|---|---|
| JP | 2020120310 | A | 8/2020 |
| WO | 2015019836 | A1 | 2/2015 |

* cited by examiner

SOLID-STATE IMAGING DEVICE AND COMPARISON DEVICE

TECHNICAL FIELD

The present disclosure relates to a solid-state imaging device and a comparison device.

BACKGROUND ART

A technique of providing a column analog to digital converter (ADC) in an image sensor and performing AD conversion for each column of pixels is widely used. In a case of speeding up AD conversion or adapting to a global shutter, a means for converting an output from a pixel into an output of a comparator by incorporating a differential amplifier circuit in the pixel instead of an analog signal may be used as a means for speeding up signal transfer.

In such a method, since the charge output from the photodiode is directly sampled in the capacitance, it is difficult to increase the capacitance value, and the influence of kT/C noise by the sampling switch is large. Furthermore, it is difficult to automatically reset the differential amplifier circuit. As a result, it is not possible to cancel the offset of the differential input circuit and the variation in the reset voltage, and it is necessary to increase the range of the reset voltage, that is, to lengthen the time for reading the reset voltage. As a result, there is a problem that the time for AD conversion is lengthened or the dynamic range is lowered instead of shortening the time for AD conversion.

CITATION LIST

Patent Document

Patent Document 1: U.S. Patent Application Publication No. 2016/0360138

SUMMARY OF THE INVENTION

Problems to be Solved by the Invention

Therefore, in the present disclosure, high-speed and high-performance signal comparison is realized. Note that the problem to be solved by the embodiment of the present disclosure can be a problem corresponding to the effects described in the embodiment as some non-limiting examples. That is, the problem corresponding to at least one of the effects described in the description of the embodiment of the present disclosure can be solved in the present disclosure.

Solutions to Problems

According to an embodiment, a solid-state imaging device includes a comparison circuit, a first switch, a second switch, a third switch, a first capacitor, and a second capacitor.

The comparison circuit includes a non-inverting input terminal and an inverting input terminal.

The first switch is connected to the inverting input terminal.

The second switch is connected to the inverting input terminal and controlled at a timing different from that of the first switch.

The third switch is connected between an output terminal of the comparison circuit and the inverting input terminal.

One end of the first capacitor is connected to the inverting input terminal via the first switch, and a reference signal is applied to the other end.

One end of the second capacitor is connected to the inverting input terminal via the second switch, and a reference signal is applied to the other end.

The comparison circuit may include:

- a first transistor that has a control terminal connected to the non-inverting input terminal, and one end connected to a positive-side power supply voltage; and
- a second transistor that has a control terminal connected to the inverting input terminal, one end connected to another end of the first transistor, another end connected to the third switch and outputting an output signal from the another end.

The non-inverting input terminal may be connected to a floating diffusion region in a pixel circuit.

The third switch may be turned on at a timing of sampling a signal.

At a timing of sampling a reset level of the floating diffusion region,

- the first switch may be turned on,
- the second switch may continue an off state,
- the first capacitor may sample a signal based on the reset level via the comparison circuit and the third switch using a standard value of the reference signal as a standard potential, and
- the first switch may be turned off after the first capacitor performs sampling.

At a timing of sampling a signal level output from a light receiving element,

- the first switch may continue an off state,
- the second switch may be turned on at a timing of the sampling,
- the second capacitor may sample the signal level via the floating diffusion, the comparison circuit, and the third switch using a standard value of the reference signal as a standard potential, and
- the second switch may be turned off after the second capacitor performs sampling.

The third switch may be turned off at a timing of comparing signals.

At a timing of reading a reset level of the floating diffusion region,

- the first switch may be turned on,
- the second switch may continue an off state,
- a ramp signal may be input to the another end of the first capacitor as the reference signal, and
- the first switch may be turned off after a signal output from the comparison circuit is inverted.

At a timing of reading a signal level output from a light receiving element,

- the first switch may continue an off state,
- the second switch may be turned on,
- a ramp signal may be input to the another end of the second capacitor as the reference signal, and
- the second switch may be turned off after a signal output from the comparison circuit is inverted.

A plurality of light receiving elements may be connected.

Each of the plurality of light receiving elements may include the first switch, the first capacitor, the second switch, and the second capacitor.

According to an embodiment, a comparison device includes a comparison circuit, a first switch, a second switch, a third switch, a first capacitor, and a second capacitor.

The comparison circuit includes a non-inverting input terminal and an inverting input terminal.

The first switch is connected to the inverting input terminal.

The second switch is connected to the inverting input terminal and controlled at a timing different from that of the first switch.

The third switch is connected between an output terminal of the comparison circuit and the inverting input terminal.

One end of the first capacitor is connected to the inverting input terminal via the first switch, and a reference signal is applied to the other end.

One end of the second capacitor is connected to the inverting input terminal via the second switch, and a reference signal is applied to the other end.

MODE FOR CARRYING OUT THE INVENTION

Figure 1:
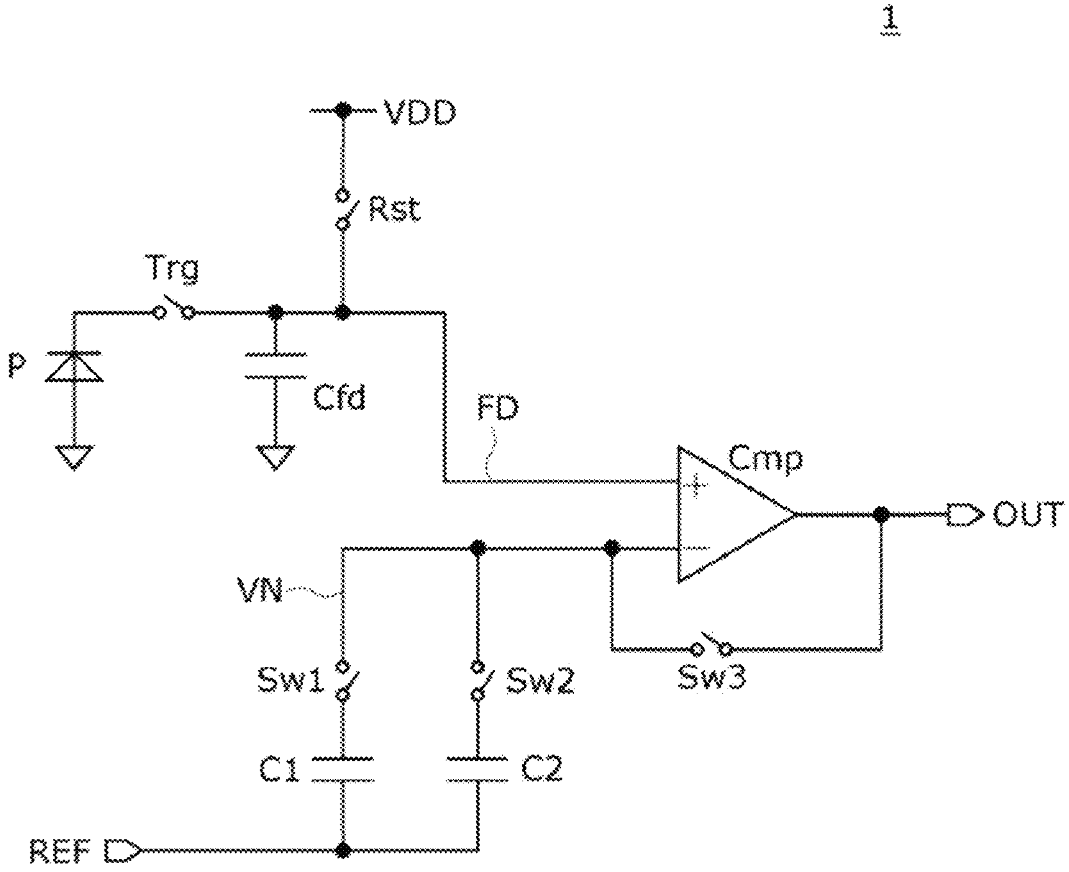
FIG. 1 is a diagram illustrating an example of a pixel circuit according to an embodiment.

The following is a description of embodiments of the present disclosure, with reference to the drawings. The drawings are used for explanation, and the shape and size of each component in actual devices, the ratios of size to other components, and the like are not necessarily as illustrated in the drawings. Furthermore, since the drawings are illustrated in a simplified manner, it should be understood that components necessary for implementation other than those illustrated in the drawings are provided as appropriate.

First Embodiment

FIG. 1 is a diagram illustrating an example of a pixel circuit according to an embodiment. A pixel circuit 1 includes a light receiving element P, a transfer switch Trg, a reset switch Rst, an FD capacitor Cfd, a comparison circuit Cmp, a first switch Sw1, a first capacitor C1, a second switch Sw2, a second capacitor C2, and a third switch Sw3. The pixel circuit 1 converts a signal corresponding to the intensity of the received light into a digital timing signal and outputs the digital timing signal. The pixel circuit 1 can be adopted, for example, in a light receiving unit of a solid-state imaging device.

The light receiving element P includes, for example, a photodiode. The light receiving element P converts light incident on the light receiving region into an analog signal by photoelectric conversion, and outputs a signal based on the intensity of the incident light.

The transfer switch Trg is connected between the output terminal (cathode) of the light receiving element P and a floating diffusion region FD. The transfer switch Trg is a switch that transfers a signal output from the light receiving element P to the floating diffusion region FD at an appropriate timing. The analog signal converted by the light receiving element P is transferred to the floating diffusion region FD at the timing when the transfer switch Trg is turned on.

The reset switch Rst is connected between a power supply voltage VDD on the positive side and the floating diffusion region FD. The switch resets the floating diffusion region FD with the power supply voltage VDD at an appropriate timing. The potential of the floating diffusion region FD is reset to a predetermined potential (reset level) at timing when the reset switch Rst is turned on.

The FD capacitor Cfd is connected between the floating diffusion region FD and a negative power supply voltage (for example, the ground potential). The FD capacitor Cfd is charged and discharged by the current flowing into the floating diffusion region FD or the current flowing out from the floating diffusion region FD, and is a capacitance that appropriately defines the potential of the floating diffusion region FD.

The potential of the floating diffusion region FD is determined by charging and discharging the electric charge of the FD capacitor Cfd by the transfer switch Trg and the reset switch Rst.

In the comparison circuit Cmp, a non-inverting input terminal is connected to the floating diffusion region FD, an inverting input terminal is connected to the first switch Sw1 and the second switch Sw2, and an output terminal is connected in a negative feedback state via the third switch Sw3. The comparison circuit Cmp is driven in two modes of a sampling mode and a comparator mode.

In the sampling mode, the comparison circuit Cmp feeds back a current based on a signal input from the non-inverting input terminal to the inverting input terminal side. Each capacitance samples the potential of the floating diffusion region FD by the fed-back current.

In the comparator mode, the non-inverting input terminal of the comparison circuit Cmp is connected to the floating diffusion region FD without performing negative feedback. The comparison circuit Cmp compares the voltage of the floating diffusion region FD with a reference voltage input from the inverting input terminal, converts the comparison result into a digital signal, and outputs the digital signal. Regarding this output signal, the timing at which the signal is inverted in an external circuit such as a counter is acquired, and the intensity of the incident light converted by the light receiving element P can be acquired as a digital value.

The first switch Sw1 is connected between the first capacitor C1 and the inverting input terminal of the comparison circuit Cmp. The second switch Sw2 is connected between the second capacitor C2 and the inverting input terminal of the comparison circuit Cmp.

The third switch Sw3 is connected between the output terminal and the inverting input terminal of the comparison circuit Cmp. The third switch Sw3 is turned on at the sampling timing and turned off at the signal comparison timing.

These switches are turned on/off at a predetermined timing, and perform operations for charging and discharging the capacitance in the sampling mode, and outputting a comparison result based on the potential charged in the capacitance in the comparator mode.

One end of the first capacitor C1 is connected to the first switch Sw1, and a reference signal is applied to the other end. One end of the second capacitor C2 is connected to the second switch Sw2, and a reference signal is applied to the other end.

Figure 2:
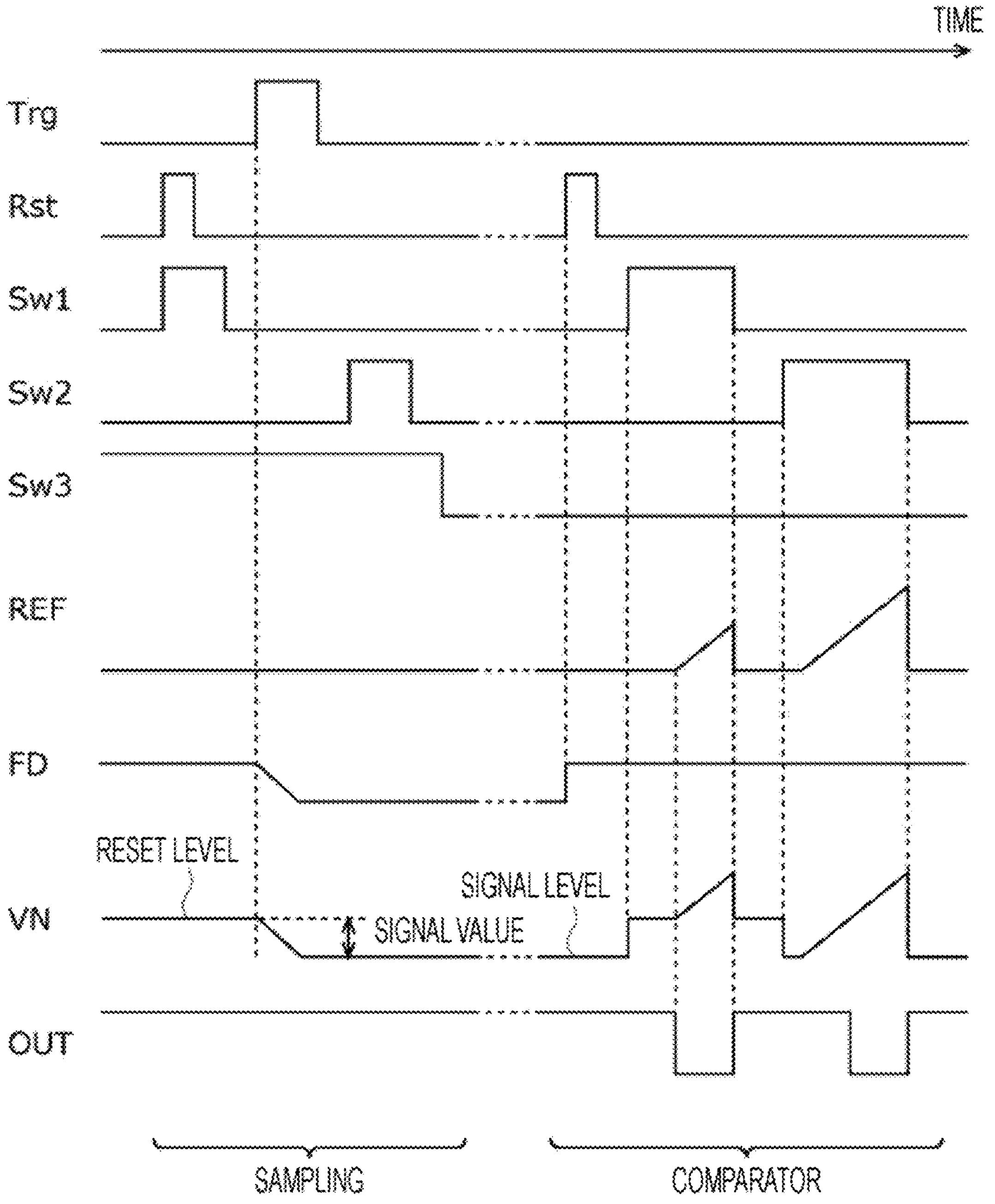
FIG. 2 is a diagram illustrating an example of a timing chart of a pixel circuit comparator according to the embodiment.

FIG. 2 is a diagram illustrating a timing chart according to an embodiment. From the top, on/off states of the transfer switch Trg, the reset switch Rst, the first switch Sw1, the second switch Sw2, and the third switch Sw3, and transitions of potentials of a reference signal REF, a floating diffusion region FD, a region VN, and an output voltage OUT are illustrated.

In a state in which the third switch Sw3 is turned on, that is, in a signal sampling state, the reset switch Rst is turned on, and the floating diffusion region FD is set to a reset level. In this state, the region VN becomes a potential based on the reset level of the floating diffusion region FD via the third switch Sw3. The first switch Sw1 and the second switch Sw2 maintain the off state.

By turning on the first switch Sw1 in this state, a potential based on the reset level is applied to the first capacitor C1. At this timing, the reference voltage REF maintains the standard voltage (initial value) of the ramp signal to be compared. Therefore, the first capacitor C1 has a potential raised from the standard level of the reference voltage REF by a potential based on the reset level of the floating diffusion region FD.

After a sufficient time for reading the reset level has elapsed, the first switch Sw1 is turned off. At this timing, the potential based on the reset level of the floating diffusion region FD is maintained in the region FD via the third switch Sw3.

After the first switch Sw1 is turned off, the transfer switch Trg is turned on to transfer the signal level output from the light receiving element P to the floating diffusion region FD. When the floating diffusion region FD becomes the signal level, the region VN transitions to the potential based on the signal level via the comparison circuit Cmp and the third switch Sw3 that is turned on. After a sufficient time has elapsed from the start of signal transfer, the transfer switch Trg is turned off.

In this state, by turning on the second switch Sw2, a potential based on this signal level is applied to the second capacitor C2. Therefore, the second capacitor C2 has a potential raised from the standard level of the reference voltage REF by a potential based on the signal level of the floating diffusion region FD.

After a sufficient time for reading the signal level has elapsed, the second switch Sw2 is turned off. Through this series of operations, the potential based on the reset level is set to the first capacitor C1, and the potential based on the signal level is set to the second capacitor C2.

As described above, the pixel circuit 1 sets the potential based on the reset level and the potential based on the signal level in the capacitor on the inverting input terminal side of the comparison circuit Cmp.

Subsequently, the pixel circuit 1 transitions to the comparator mode in which the comparison circuit Cmp operates as a comparator. In the comparator mode, the third switch Sw3 is turned off. That is, the third switch Sw3 is turned off at the timing of signal comparison.

After the third switch Sw3 is turned off, the reset switch Rst is turned on to set the floating diffusion region FD to the reset level.

Next, the first switch Sw1 is turned on, and a ramp signal is input to the reference signal REF. When the first capacitor C1 is connected to the inverting input terminal and the reference signal REF is used as a ramp signal, the ramp signal based on the potential stored in the first capacitor C1 is applied to the inverting input terminal of the comparison circuit Cmp. When the potential applied to the inverting input terminal becomes equal to the potential of the non-inverting input terminal, that is, when the potential becomes equal to the voltage sampled by the first capacitor C1, the output of the comparison circuit Cmp is inverted, and an output voltage VOUT transitions from High to Low.

The first switch Sw1 is turned off after a sufficient time has elapsed since the output voltage VOUT has been inverted. This time can be, for example, a time until the ramp signal reaches a predetermined value.

The reset level is detected by reading a count value synchronized with the ramp signal by a latch, a counter, or the like provided outside the pixel circuit 1 while the output voltage VOUT is High.

Subsequently, the pixel circuit 1 reads a signal level. In reading the signal level, the second switch Sw2 is turned on, and the ramp signal is input to the reference signal REF. When the second capacitor C2 is connected to the inverting input terminal and the reference signal REF is used as a ramp signal, the ramp signal based on the potential stored in the second capacitor C2 is applied to the inverting input terminal of the comparison circuit Cmp. Similarly to the above, when the potential applied to the inverting input terminal becomes equal to the potential of the non-inverting input terminal, the output voltage VOUT transitions from High to Low.

The second switch Sw2 is turned off after a sufficient time has elapsed since the output voltage VOUT has been inverted. This time can be, for example, a time until the ramp signal reaches a predetermined value.

The signal level is detected by reading a count value synchronized with the ramp signal by a latch, a counter, or the like provided outside the pixel circuit 1 while the output voltage VOUT is High. By taking a difference between this signal level and the reset level, it is possible to acquire a digital signal of the signal level from which noise has been removed.

As described above, according to the present embodiment, the solid-state imaging device can set the output of the comparison circuit Cmp as the output of the pixel circuit 1. By performing the comparison in the pixel circuit, it is possible to output an appropriate comparison signal at high speed for each pixel and in a state in which the dynamic range is not lowered. In the ADC arranged outside the pixel circuit, it is possible to appropriately acquire a signal based on the intensity of light incident on the light receiving element by reading the counter synchronized with the ramp signal.

Second Embodiment

Figure 3:
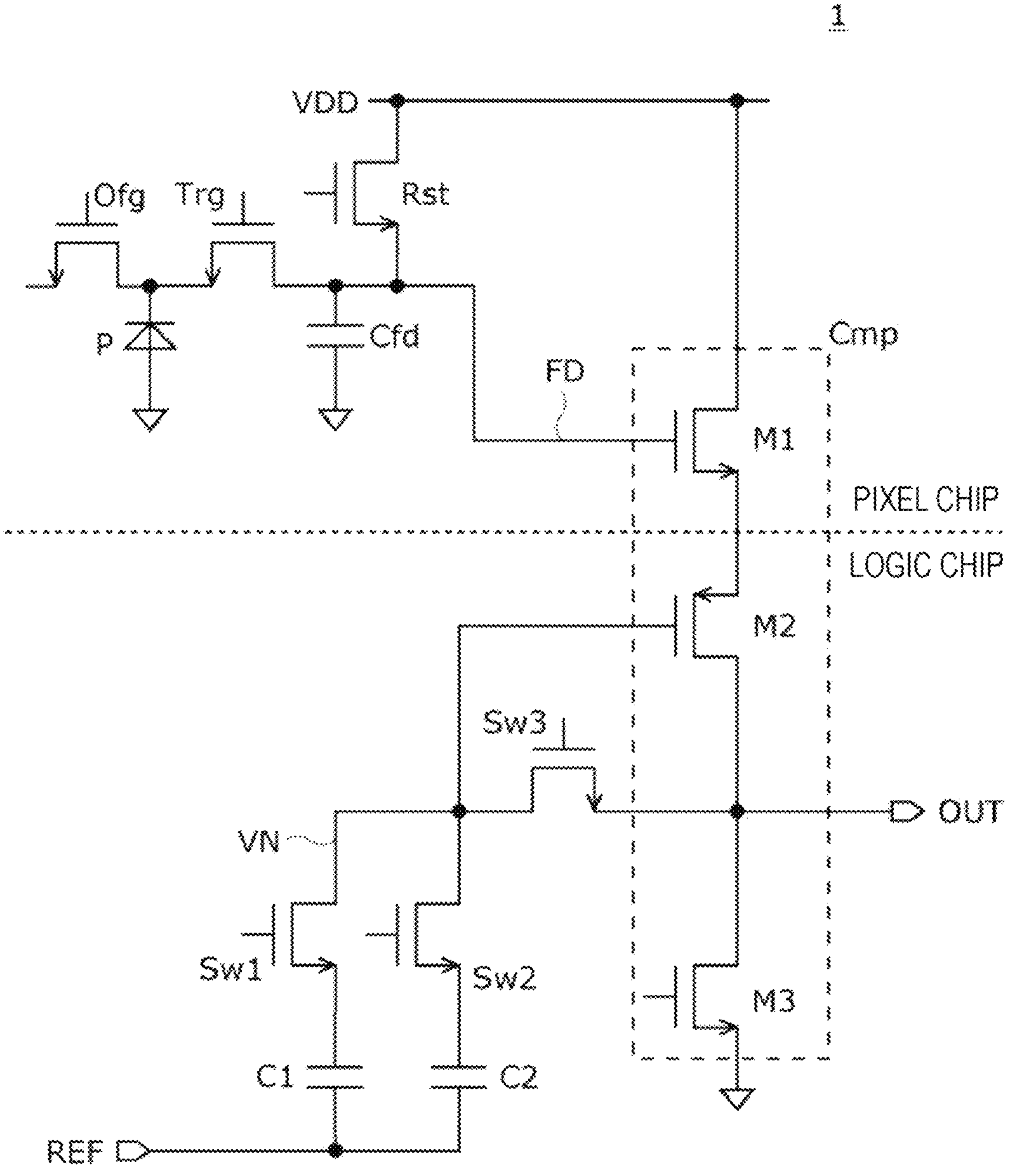
FIG. 3 is a diagram illustrating an example of the pixel circuit according to the embodiment.

FIG. 3 is a diagram illustrating a mounting example of a pixel circuit according to an embodiment. The pixel circuit 1 may be separately mounted into a pixel chip including the light receiving element P and a logic chip that outputs the comparison circuit Cmp.

The pixel chip includes, for example, a light receiving region of a pixel array, and includes a light receiving element and a circuit for appropriately outputting an analog signal. The logic chip is, for example, a chip including a circuit that performs signal sampling and comparison and outputs a high/low digital signal as an output voltage, an ADC that performs subsequent processing, a signal processing circuit, an image processing circuit, a storage circuit, an input/output interface, and the like.

Each of the transfer switch Trg and the reset switch Rst may include an n-type MOSFET. By applying an appropriate voltage to the gate at an appropriate timing, the reset of the floating diffusion region FD and the signal transfer processing are executed.

On the output end (for example, a cathode) side of the light receiving element P, a discharge transistor Ofg may be provided together with the transfer transistor Trg. The discharge transistor Ofg is a transistor that discharges the charges accumulated on the output end side of the light receiving element P at an appropriate timing. The discharge transistor Ofg may include, for example, an n-type MOSFET. The discharge transistor Ofg discharges and resets the charges accumulated at the output end of the light receiving element P by applying an appropriate voltage to the gate at an appropriate timing.

The comparison circuit Cmp includes a first transistor M1, a second transistor M2, and a third transistor M3.

The first transistor M1 is, for example, an n-type MOSFET, and its gate operates as a non-inverting input terminal of the comparison circuit Cmp. For example, the drain of the first transistor M1 is connected to the power supply voltage VDD on the positive side.

The second transistor M2 is, for example, a p-type MOSFET, and its gate operates as an inverting input terminal of the comparison circuit Cmp. For example, the source of the first transistor M2 is connected to the source of the first transistor M1, and its drain is connected to the output terminal of the comparison circuit Cmp.

The third transistor M3 is, for example, an n-type MOSFET, its drain is connected to the drain of the second transistor M2, its source is connected to a negative power supply voltage (for example, the ground voltage), and a bias voltage is applied to a gate of the third transistor M3. The bias voltage may be, for example, a signal used to select a line in the pixel array. That is, the output from the comparison circuit Cmp may be controlled by the voltage applied to the gate of the third transistor M3.

Each of the first switch Sw1, the second switch Sw2, and the third switch Sw3 may be, for example, an n-type MOSFET. In each of these switches, a signal for performing drive control is applied to the gate at an appropriate timing, and the above-described operation is executed.

According to the configuration of FIG. 3 as an example, when the third switch Sw3 is turned on in the sampling mode, the comparison circuit Cmp operates as a voltage follower having the voltage of the floating diffusion region FD as an input. As a result, the output impedance can be reduced, an appropriate signal can be maintained in the first capacitor C1 and the second capacitor C2 regardless of the loads of the first switch Sw1 and the second switch Sw2, and kT/C noise caused by these switches can be reduced. Furthermore, according to this circuit configuration, since the voltage follower and the comparator can also be used, the area of the circuit can be maintained small.

Furthermore, in the sampling mode, the reset level is held in the first capacitor C1, and the held potential can be read out in the comparator mode. That is, the reset level can be read from the reset state. Therefore, before reading the reset level, signal comparison can be started without performing the auto-zero setting of the charge state of the circuit again. As a result, it is possible to shorten the AD conversion time and expand the dynamic range without adding the auto-zero execution time.

Third Embodiment

The pixel circuits described in the above-described embodiments are arranged in a two-dimensional array in a line direction and a column direction in a pixel chip, for example, to form a pixel array. In the pixel array, for example, a light receiving element is designated by a horizontal direction control circuit that selects a line and a vertical direction control circuit that designates a column. The signal from the designated light receiving element is transferred to the circuit of the logic chip, and processing such as AD conversion is executed.

Figure 4:
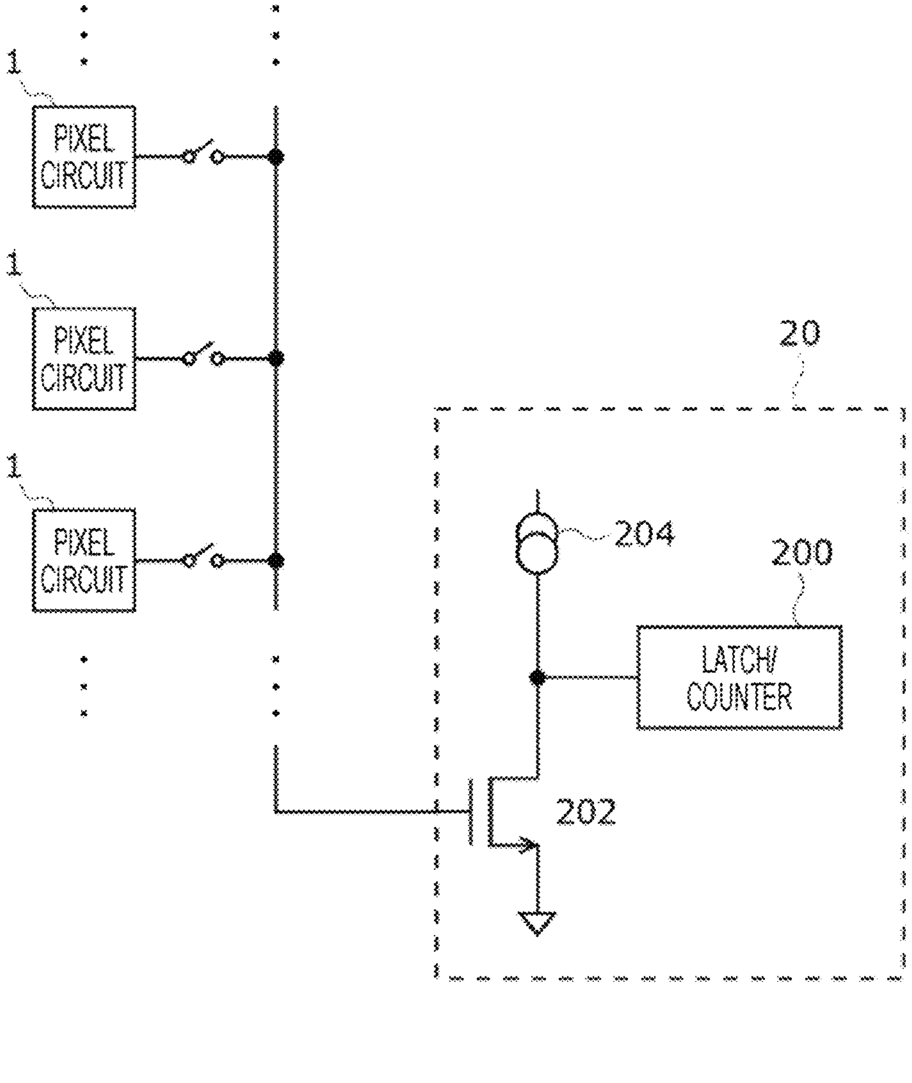
FIG. 4 is a diagram illustrating an example of the pixel circuit according to the embodiment.

FIG. 4 is a diagram illustrating an example of the connection of a pixel circuit according to an embodiment. In this drawing, only the pixel circuit of one column is illustrated, but the pixel circuit and the circuit such as the ADC are appropriately provided for each column or each of a plurality of columns.

Each of the pixel circuits 1 provided in the column is connected to a column unit circuit 20. The column unit circuit 20 is a circuit provided in the logic chip for each column. The column unit circuit 20 includes a latch/counter 200, an input transistor 202, and a current source 204.

The latch/counter 200 calculates a count value on the basis of a High/Low signal output from the pixel circuit 1, subtracts a reset level from a signal level, and acquires a pixel value from which noise has been removed. For example, the latch/counter 200 counts the number of clocks synchronized with the rising (or falling) of the ramp signal to acquire a count value of the ramp signal, and calculates a pixel value on the basis of the acquired count value.

The input transistor 202 is, for example, an n-type MOSFET. When a signal output from the pixel circuit 1 is applied to the gate and a High signal is applied to the gate, a drain current flows. When a Low signal is applied to the gate, a current output from the current source 204 flows to the latch/counter 200.

That is, the current output from the current source 204 flows to the latch/counter 200 in a case where the output from the pixel circuit 1 is High, and flows to the ground point in a case where the output from the pixel circuit 1 is Low. As a result, the latch/counter 200 can execute appropriate counting on the basis of the current flowing from the current source 204.

Note that, in the above description, the column unit circuit, that is, the circuit operating as the column ADC has been described, but the present invention is not limited thereto. For example, the circuit operating as the ADC may be provided as a circuit in units of pixels, a circuit in units of a plurality of columns, or a circuit in units of areas.

Furthermore, a switch may be provided between the pixel circuit 1 and the column unit circuit 20. This switch is a switch that is turned on in the selected line, and with this switch, an output from the selected pixel circuit 1 can be acquired.

In the case of a circuit in units of a plurality of columns or a circuit in units of areas, this switch can operate as a switch that is turned on in a case where the switch is specified by a line and a column. With this operation, these circuits can perform AD conversion on signals from appropriate pixels.

Fourth Embodiment

Figure 5:
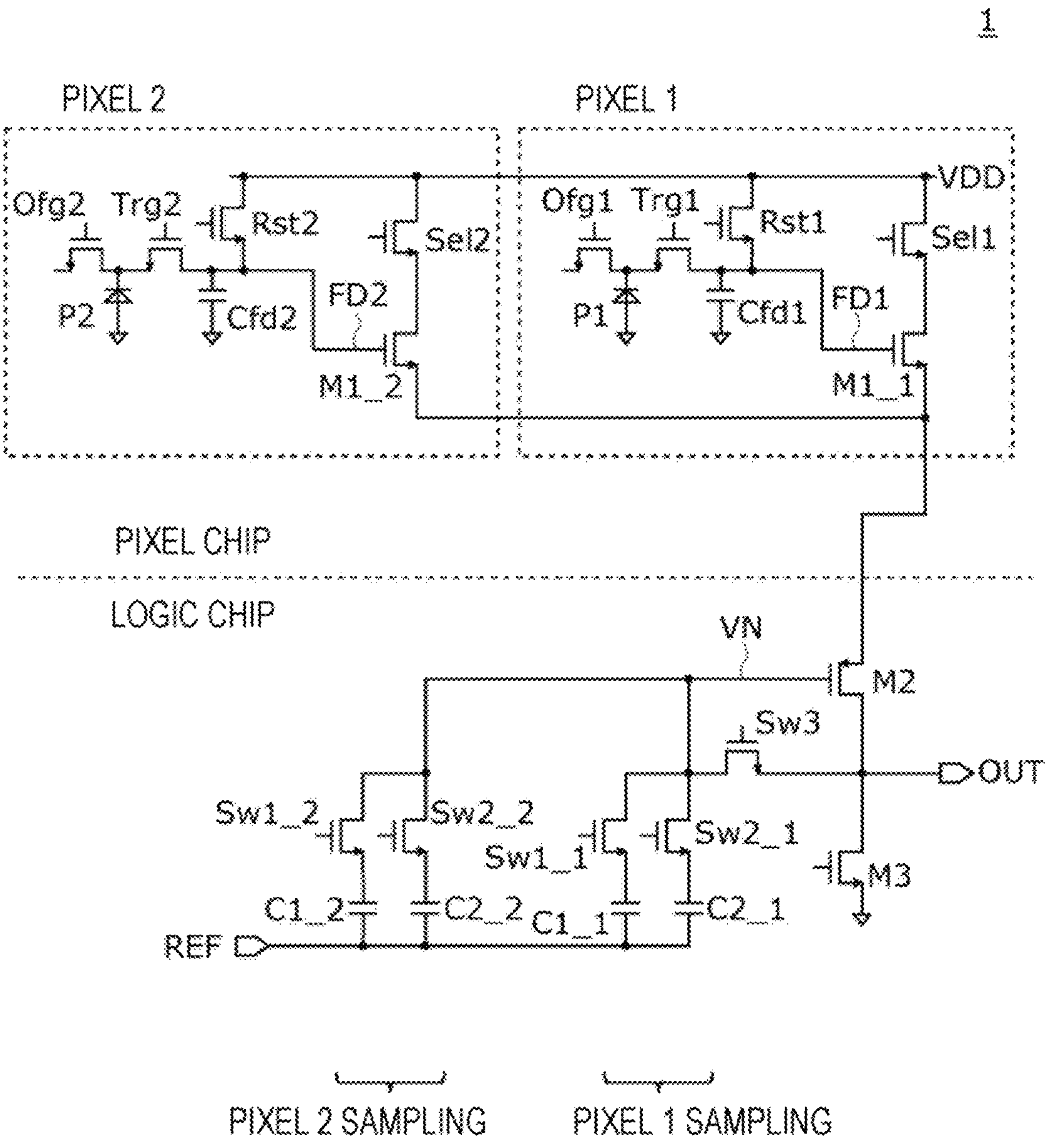
FIG. 5 is a diagram illustrating an example of a pixel circuit according to the embodiment.

FIG. 5 is a diagram illustrating an example of the pixel circuit 1 according to an embodiment. In each of the above-described embodiments, one comparison circuit is provided for one light receiving element, but the mode of the present disclosure is not limited thereto. That is, the plurality of light receiving elements may share the comparison circuit.

At least a part of the comparison circuit Cmp may be shared by a plurality of pixels (a plurality of light receiving elements). For example, as illustrated in FIG. 5, some transistors (the second transistor M2 and the third transistor M3) of the comparison circuit Cmp may be shared between the pixel 1 and the pixel 2.

As illustrated in the drawing, the transfer transistor Trg, the reset transistor Rst, and the discharge transistor Ofg are provided for each pixel, and first transistors M1_1 and M1_2 are provided as a part of the comparison circuit Cmp so as to be connected to the floating diffusion regions FD1 and FD2, respectively.

In this case, selection transistors Sel1 and Sel2 for selectively driving the pixels may be further provided between the drain of the first transistor and the power supply voltage to control driving of each pixel.

The same signal may be input to the transfer transistor, the reset transistor, and the discharge transistor at the same timing. In this case, the output from the pixel 1 and the output from the pixel 2 can be switched by appropriately driving the selection transistor.

On the logic chip side, a capacitor for sampling and reading is provided for each pixel. By providing the capacitor for each pixel in this manner, input/output of the same phase can be collectively realized.

For example, first, the output from the pixel 1 is enabled by turning on the selection transistor Sel1 and turning off the selection transistor Sel2. Similarly to the above sampling mode, the reset level of the pixel 1 is sampled by a first capacitor C1_1 by controlling a first switch Sw1_1, the second switch Sw2_1, and the third switch Sw3 at this timing.

Subsequently, by turning off the selection transistor Sel1, turning on the selection transistor Sel2, and controlling a first switch Sw2_2, a second switch Sw2_2, and the third switch Sw3, the reset level of the pixel 2 is sampled by a first capacitor C1_2.

Subsequently, by turning on the selection transistor Sel1, turning off the selection transistor Sel2, and further driving the transfer transistor, the signal values generated by light receiving elements P1 and P2 are read into the floating diffusion regions FD1 and FD2, respectively. Then, by controlling the first switch Sw1_1, the second switch Sw2_1, and the third switch Sw3, the signal level of the pixel 1 is sampled by a second capacitor C2_1.

Subsequently, by turning off the selection transistor Sel1, turning on the selection transistor Sel2, and controlling the first switch Sw1_2, the second switch Sw2_2, and the third switch Sw3, the signal level of the pixel 1 is sampled by a second capacitor C2_2.

Note that, not limited to this order, for example, after the sampling of the reset level is finished, the signal level of the pixel 2 may be sampled in the second capacitor C2_2 without changing the state of the selection transistor, and then the signal level of the pixel 1 may be sampled in the second capacitor C2_1 after the selection state is controlled.

Moreover, the floating diffusion region FD may be shared.

In the above description, although a mode in which two pixels share a part of the comparison circuit Cmp has been described, three or more light receiving elements may share a part of the comparison circuit Cmp. In this case as well, it is possible to appropriately acquire the signal value of each pixel by switching in a similar manner.

As described above, according to the configuration of the pixel circuit according to the present embodiment, it is possible to further reduce the circuit area as compared with each of the above-described embodiments. Also in this case, the accuracy of the signal value can be increased, and the time for AD conversion can be reduced without deteriorating the dynamic range in comparison with a general pixel circuit.

Figure 6:
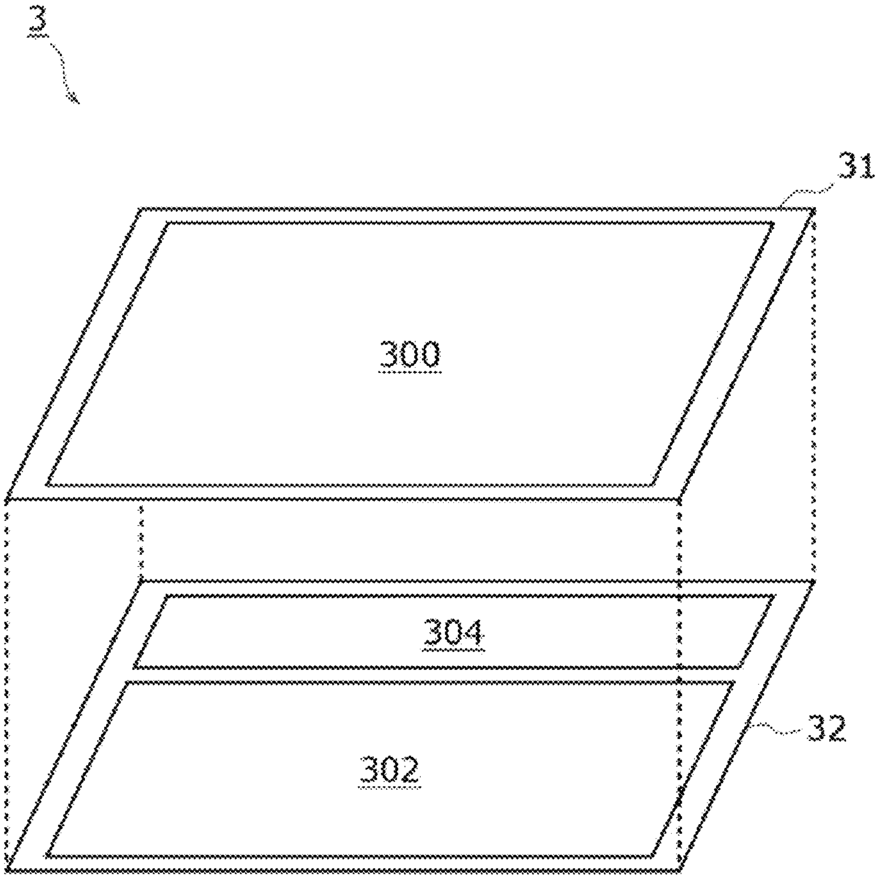
FIG. 6 is a diagram illustrating an example of mounting of a semiconductor chip according to the embodiment.

FIG. 6 is a non-limiting implementation example of an image sensor chip 3 including the pixel circuits 1 according to the above-described embodiments. In the solid-state imaging device, the image sensor chip 3 may be formed by a first semiconductor layer 31 and a second semiconductor layer 32 which are different semiconductor layers. The first semiconductor layer 31 includes a light receiving region 300 in which the pixel circuits 1 are arranged in a two-dimensional array, and the second semiconductor layer 32 includes a storage circuit 302 and a processing circuit 304.

For example, the first semiconductor layer 31 is a pixel chip in FIGS. 3 and 5, and the second semiconductor layer 32 is a logic chip.

The first semiconductor layer 31 and the second semiconductor layer 32 are stacked, formed as an integrated semiconductor device, and operate. For example, the first semiconductor layer 31 is disposed closer to the optical system for condensing the incident light on the light receiving element than the second semiconductor layer 32, the light through the optical system is received by the first semiconductor layer 31, and a signal is output to the second semiconductor layer 32.

Figure 7:
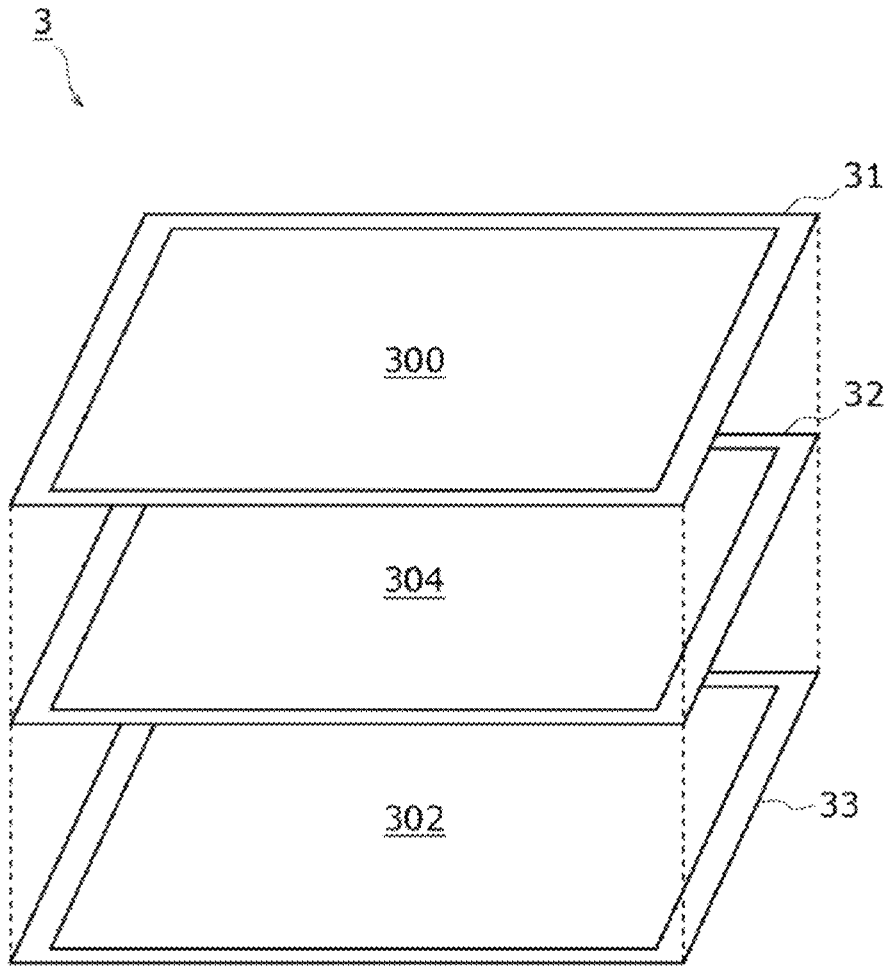
FIG. 7 is a diagram illustrating an example of mounting of a semiconductor chip according to an embodiment.

FIG. 7 is another implementation example different from the above. The solid-state imaging element may be mounted on a first semiconductor layer 31, a second semiconductor layer 32, and a third semiconductor layer 33 which are different semiconductor layers. The first semiconductor layer 31 includes a light receiving region 300, the second semiconductor layer 32 includes a processing circuit 304, and the third semiconductor layer 33 includes a storage circuit 302. The first semiconductor layer 31, the second semiconductor layer 32, and the third semiconductor layer 33 are stacked and formed as an integrated semiconductor device, and operate. For example, the first semiconductor layer 31 is disposed closest to the optical system, light via the optical system is received by the first semiconductor layer 31, and a signal is output to at least one of the second semiconductor layer 32 and the third semiconductor layer 33.

In the case of the forms illustrated in FIGS. 6 and 7, the semiconductor layers may adopt, for example, a chip on chip (CoC) method in which the semiconductor layers are cut out from a wafer, divided into individual pieces, and then stacked and bonded to each other vertically. Furthermore, a chip on wafer (CoW) method may be adopted in which any one layer is cut out and divided into individual pieces, and then bonded to a wafer. Alternatively, a wafer on wafer (WoW) method may be adopted in which pieces of wear are bonded to each other and then divided into individual pieces.

For bonding the semiconductor layers, a via hole, a microbump, a micropad, plasma bonding, or the like can be used as a non-restrictive example. By such a method, the semiconductor layers are appropriately electrically connected and formed so as to be able to transmit and receive signals.

The technology according to the present disclosure can be applied to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, a robot, a building machine, or an agricultural machine (tractor).

Figure 8:
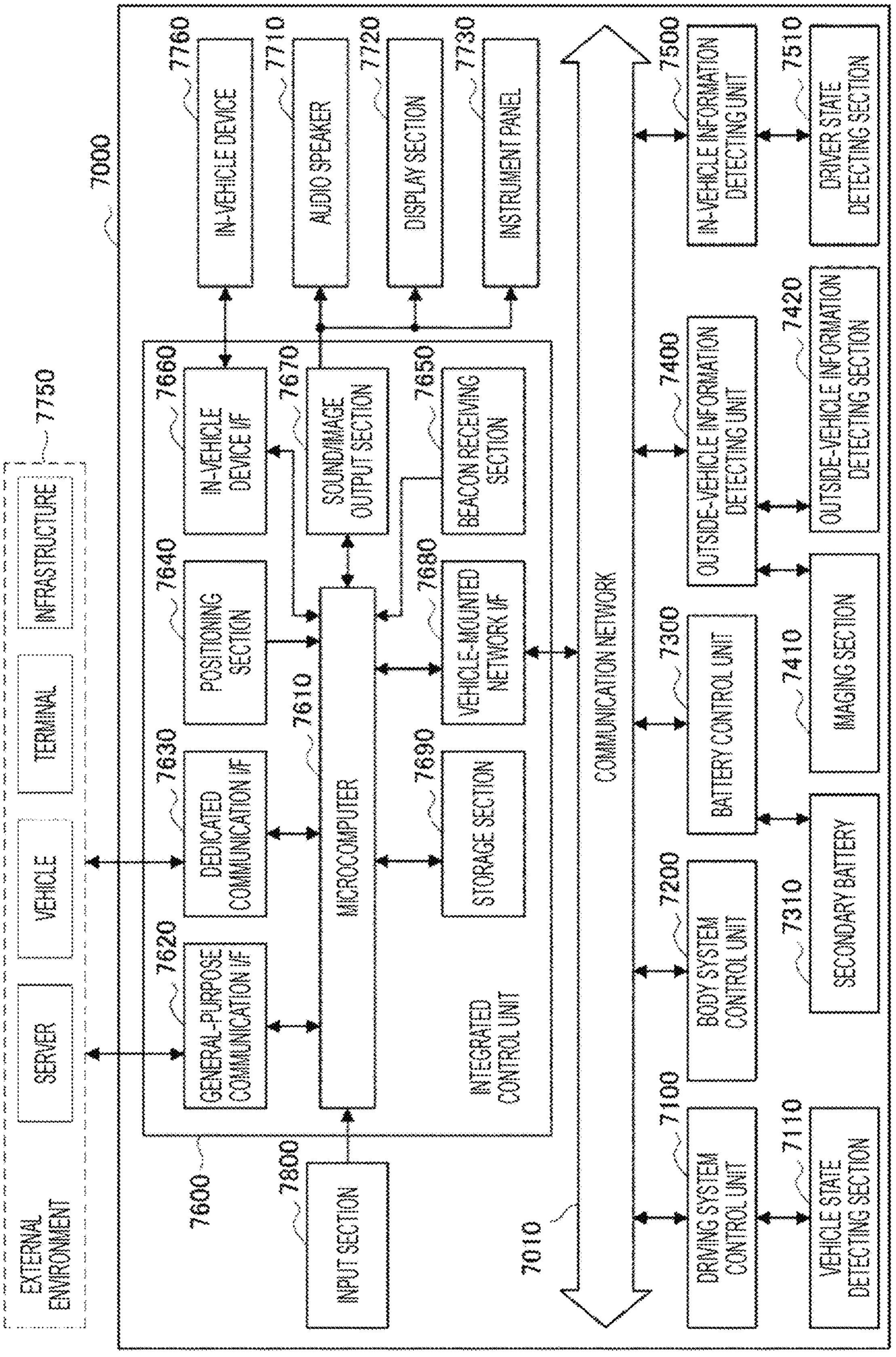
FIG. 8 is a block diagram illustrating an example of schematic configuration of a vehicle control system.

FIG. 8 is a block diagram illustrating a schematic configuration example of a vehicle control system 7000 as an example of a mobile body control system to which the technology of the present disclosure is applied. The vehicle control system 7000 includes a plurality of electronic control units connected to each other via a communication network 7010. In the example illustrated in FIG. 8, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. In FIG. 8, a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690 are illustrated as a functional configuration of the integrated control unit 7600. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 9:
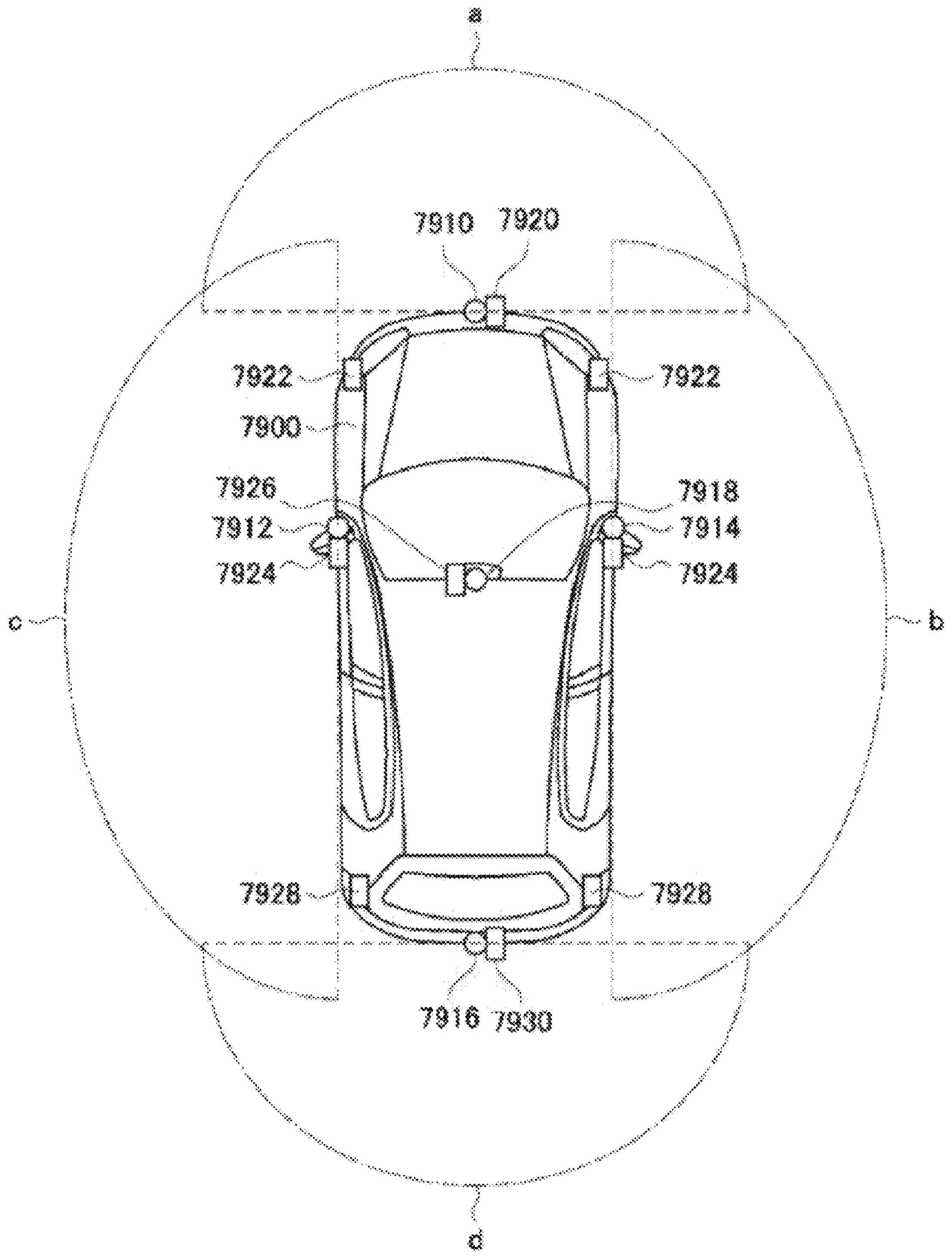
FIG. 9 is an explanatory diagram illustrating an example of installation positions of an outside-vehicle information detecting section and an imaging section.

Here, FIG. 9 illustrates an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle

7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Note that FIG. 9 illustrates an example of the imaging range of each of the imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Referring back to FIG. 8, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), worldwide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automated driving, which makes the vehicle to travel automatedly without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 8, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Note that, in the example illustrated in FIG. 8, at least two control units connected through the communication network 7010 may be integrated as one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Note that a computer program for realizing each function of a solid-state imaging device including the pixel circuit 1 according to the present embodiment described with reference to FIGS. 1 to 7 or an electronic apparatus including the solid-state imaging device can be mounted on any control unit or the like. Furthermore, a computer-readable recording medium in which such a computer program is stored can be provided. The recording medium is, for example, a magnetic disk, an optical disk, a magneto-optical disk, a flash memory, or the like. Furthermore, the computer program described above may be distributed via, for example, a network without using a recording medium.

In the vehicle control system 7000 described above, the solid-state imaging device including the pixel circuit 1 according to the present embodiment described with reference to FIGS. 1 to 7 or the electronic apparatus including the solid-state imaging device can be applied to at least a part of a portion where imaging is performed, such as the imaging section 7410, the outside-vehicle information detecting section 7420, or the driver state detecting section 7510 of the application example illustrated in FIG. 8.

Furthermore, at least a subset of the components of the pixel circuit 1 described with reference to FIGS. 1 to 7 may be achieved in a module (for example, an integrated circuit module including one die) for the integrated control unit 7600 illustrated in FIG. 8. Alternatively, the image sensor chip 3 described with reference to FIGS. 6 and 7 may be implemented across a plurality of control units of the vehicle control system 7000 illustrated in FIG. 8.

The embodiments described above may have the following modes.

(1)

A solid-state imaging device including:
- a comparison circuit that has a non-inverting input terminal and an inverting input terminal;
- a first switch that is connected to the inverting input terminal;
- a second switch that is connected to the inverting input terminal and controlled at a timing different from a timing of the first switch;
- a third switch that is connected between an output terminal of the comparison circuit and the inverting input terminal;
- a first capacitor that has one end connected to the inverting input terminal via the first switch and another end to which a reference signal is applied; and
- a second capacitor that has one end connected to the inverting input terminal via the second switch and another end to which the reference signal is applied.

(2)

The solid-state imaging device according to (1), in which the comparison circuit includes:
- a first transistor that has a control terminal connected to the non-inverting input terminal, and one end connected to a positive-side power supply voltage; and
- a second transistor that has a control terminal connected to the inverting input terminal, one end connected to another end of the first transistor, another end connected to the third switch and outputting an output signal from the another end.

(3)

The solid-state imaging device according to (1) or (2), in which
- the non-inverting input terminal is connected to a floating diffusion region in a pixel circuit.

(4)

The solid-state imaging device according to (3), in which
- the third switch is turned on at a timing of sampling a signal.

(5)

The solid-state imaging device according to (4), in which
- at a timing of sampling a reset level of the floating diffusion region,
- the first switch is turned on,
- the second switch continues an off state,
- the first capacitor samples a signal based on the reset level via the comparison circuit and the third switch using a standard value of the reference signal as a standard potential, and
- the first switch is turned off after the first capacitor performs sampling.

(6)

The solid-state imaging device according to (4) or (5), in which
- at a timing of sampling a signal level output from a light receiving element,
- the first switch continues an off state,
- the second switch is turned on at a timing of the sampling,
- the second capacitor samples the signal level via the floating diffusion, the comparison circuit, and the third switch using a standard value of the reference signal as a standard potential, and
- the second switch is turned off after the second capacitor performs sampling.

(7)

The solid-state imaging device according to any one of (3) to (6), in which
- the third switch is turned off at a timing of comparing signals.

(8)

The solid-state imaging device according to (7), in which
- at a timing of reading a reset level of the floating diffusion region,
- the first switch is turned on,
- the second switch continues an off state,
- a ramp signal is input to the another end of the first capacitor as the reference signal, and the first switch is turned off after a signal output from the comparison circuit is inverted.

(9)

The solid-state imaging device according to (7) or (8), in which at a timing of reading a signal level output from a light receiving element, the first switch continues an off state, the second switch is turned on, a ramp signal is input to the another end of the second capacitor as the reference signal, and the second switch is turned off after a signal output from the comparison circuit is inverted.

(10)

The solid-state imaging device according to any one of (1) to (9), in which a plurality of light receiving elements is connected.

(11)

The solid-state imaging device according to (10), in which each of the plurality of light receiving elements includes the first switch, the first capacitor, the second switch, and the second capacitor.

(12)

A comparison device including:

a comparison circuit that has a non-inverting input terminal and an inverting input terminal;

a first switch that is connected to the inverting input terminal;

a second switch that is connected to the inverting input terminal and controlled at a timing different from a timing of the first switch;

a third switch that is connected between an output terminal of the comparison circuit and the inverting input terminal;

a first capacitor that has one end connected to the inverting input terminal via the first switch and another end to which a reference signal is applied; and a second capacitor that has one end connected to the inverting input terminal via the second switch and another end to which the reference signal is applied.

Aspects of the present disclosure are not limited to the above-described embodiments, but include various conceivable modifications, and the effects of the present disclosure are not limited to the above-described contents. The components in each of the embodiments may be appropriately combined and applied. That is, various additions, modifications, and partial deletions can be made without departing from the conceptual idea and gist of the present disclosure derived from the contents defined in the claims and equivalents and the like thereof.

REFERENCE SIGNS LIST

1 Pixel circuit
Sw1 First switch
Sw2 Second switch
Sw3 Third switch
C1 First capacitor
C2 Second capacitor
Cmp Comparison circuit
M1 First transistor
M2 Second transistor
M3 Third transistor
Trg Transfer switch
Rst Reset switch
Ofg Discharge transistor
FD Floating diffusion region
Cfd FD capacitor
P Light receiving element
20 Column unit circuit
200 Latch/counter
202 Input transistor
204 Current source
3 Image sensor chip
31 First semiconductor layer
32 Second semiconductor layer
33 Third semiconductor layer
300 Light receiving region
302 Storage circuit
304 Processing circuit

The invention claimed is:

1. A solid-state imaging device comprising:

a comparison circuit that has a non-inverting input terminal and an inverting input terminal;

a first switch that is connected to the inverting input terminal;

a second switch that is connected to the inverting input terminal and controlled at a timing different from a timing of the first switch;

a third switch that is connected between an output terminal of the comparison circuit and the inverting input terminal;

a first capacitor that has one end connected to the inverting input terminal via the first switch and another end to which a reference signal is applied; and a second capacitor that has one end connected to the inverting input terminal via the second switch and another end to which the reference signal is applied, wherein the comparison circuit includes:

a first transistor that has a control terminal connected to the non-inverting input terminal, and one end connected to a positive-side power supply voltage; and a second transistor that has a control terminal connected to the inverting input terminal, one end connected to another end of the first transistor, another end connected to the third switch and outputting an output signal from the another end.

2. The solid-state imaging device according to claim 1, wherein the non-inverting input terminal is connected to a floating diffusion region in a pixel circuit.

3. The solid-state imaging device according to claim 1, further comprising:

a plurality of light receiving elements.

4. The solid-state imaging device according to claim 3, wherein each of the plurality of light receiving elements includes the first switch, the first capacitor, the second switch, and the second capacitor.

5. A solid-state imaging device comprising:

a comparison circuit that has a non-inverting input terminal and an inverting input terminal;

a first switch that is connected to the inverting input terminal;

a second switch that is connected to the inverting input terminal and controlled at a timing different from a timing of the first switch;

a third switch that is connected between an output terminal of the comparison circuit and the inverting input terminal;

a first capacitor that has one end connected to the inverting input terminal via the first switch and another end to which a reference signal is applied; and a second capacitor that has one end connected to the inverting input terminal via the second switch and another end to which the reference signal is applied, wherein the non-inverting input terminal is connected to a floating diffusion region in a pixel circuit, and the third switch is turned on at a timing of sampling a signal.

6. The solid-state imaging device according to claim 5, wherein at a timing of sampling a reset level of the floating diffusion region, the first switch is turned on, the second switch continues an off state, the first capacitor samples a signal based on the reset level via the comparison circuit and the third switch using a standard value of the reference signal as a standard potential, and the first switch is turned off after the first capacitor performs sampling.

7. The solid-state imaging device according to claim 5, wherein at a timing of sampling a signal level output from a light receiving element, the first switch continues an off state, the second switch is turned on at a timing of the sampling, the second capacitor samples the signal level via the floating diffusion region, the comparison circuit, and the third switch using a standard value of the reference signal as a standard potential, and the second switch is turned off after the second capacitor performs sampling.

8. A solid-state imaging device comprising:

a comparison circuit that has a non-inverting input terminal and an inverting input terminal;

a first switch that is connected to the inverting input terminal;

a second switch that is connected to the inverting input terminal and controlled at a timing different from a timing of the first switch;

a third switch that is connected between an output terminal of the comparison circuit and the inverting input terminal;

a first capacitor that has one end connected to the inverting input terminal via the first switch and another end to which a reference signal is applied; and a second capacitor that has one end connected to the inverting input terminal via the second switch and another end to which the reference signal is applied, wherein the non-inverting input terminal is connected to a floating diffusion region in a pixel circuit, and the third switch is turned off at a timing of comparing signals.

9. The solid-state imaging device according to claim 8, wherein at a timing of reading a reset level of the floating diffusion region, the first switch is turned on, the second switch continues an off state, a ramp signal is input to the another end of the first capacitor as the reference signal, and the first switch is turned off after a signal output from the comparison circuit is inverted.

10. The solid-state imaging device according to claim 8, wherein at a timing of reading a signal level output from a light receiving element, the first switch continues an off state, the second switch is turned on, a ramp signal is input to the another end of the second capacitor as the reference signal, and the second switch is turned off after a signal output from the comparison circuit is inverted.

11. A comparison device comprising:

a comparison circuit that has a non-inverting input terminal and an inverting input terminal;

a first switch that is connected to the inverting input terminal;

a second switch that is connected to the inverting input terminal and controlled at a timing different from a timing of the first switch;

a third switch that is connected between an output terminal of the comparison circuit and the inverting input terminal;

a first capacitor that has one end connected to the inverting input terminal via the first switch and another end to which a reference signal is applied; and a second capacitor that has one end connected to the inverting input terminal via the second switch and another end to which the reference signal is applied, wherein the non-inverting input terminal is connected to a floating diffusion region in a pixel circuit, and the third switch is turned on at a timing of sampling a signal.

* * * * *